(12) United States Patent
Marx et al.

(10) Patent No.: US 7,058,840 B2
(45) Date of Patent: Jun. 6, 2006

(54) METHOD AND APPARATUS FOR GENERATING A SECOND SIGNAL HAVING A CLOCK BASED ON A SECOND CLOCK FROM A FIRST SIGNAL HAVING A FIRST CLOCK

(75) Inventors: Thilo Marx, Villingen-Schwenningen (DE); Peter Schrögmeier, München (DE)

(73) Assignee: Infineon Technologies AG, Munich (DE)

(*) Notice: Subject to any disclaimer, the term of this patent is extended or adjusted under 35 U.S.C. 154(b) by 539 days.

(21) Appl. No.: 10/143,600

(22) Filed: May 10, 2002

(65) Prior Publication Data

US 2002/0178392 A1    Nov. 28, 2002

(30) Foreign Application Priority Data

May 10, 2001  (DE) ................................ 101 22 702

(51) Int. Cl.
*G06F 1/04* (2006.01)
(52) U.S. Cl. ........................................ 713/500; 713/503
(58) Field of Classification Search ................ 713/500, 713/503
See application file for complete search history.

(56) References Cited

U.S. PATENT DOCUMENTS

| | | | | |
|---|---|---|---|---|
| 5,272,391 A | * | 12/1993 | Ampe et al. ................. | 327/141 |
| 5,835,444 A | * | 11/1998 | Kim et al. ................... | 365/233 |
| 5,969,576 A | * | 10/1999 | Trodden ...................... | 331/1 A |
| 6,018,258 A | * | 1/2000 | Kang ........................... | 327/115 |
| 6,292,507 B1 | * | 9/2001 | Hardin et al. ................ | 375/130 |
| 6,323,791 B1 | * | 11/2001 | Murden et al. ............. | 341/118 |
| 6,651,122 B1 | * | 11/2003 | Porterfield .................. | 710/100 |
| 6,788,753 B1 | * | 9/2004 | Brown ........................ | 375/368 |

FOREIGN PATENT DOCUMENTS

| | | |
|---|---|---|
| DE | 197 37 589 C1 | 11/1998 |
| EP | 0 547 768 B1 | 6/1993 |
| EP | 0 798 630 A1 | 10/1997 |
| WO | WO 99/28806 | 6/1999 |

OTHER PUBLICATIONS

Roth, Jr., Charles H., Fundamentals of Logic Design, 1985, West Publishing, Third Edition, p. 37.*

* cited by examiner

*Primary Examiner*—Lynne H. Browne
*Assistant Examiner*—Tse Chen
(74) *Attorney, Agent, or Firm*—Laurence A. Greenberg; Werner H. Stemer; Ralph E. Locher

(57) ABSTRACT

An apparatus for generating a second signal having a clock based on a second clock from a first signal with a first clock comprises first and second means for sampling the first signal to determine whether the first signal has a predetermined logic state, wherein first means samples the first signal with the second clock, and second means samples the first signal with a clock phase shifted to the second clock. Means for generating the second signal generates the second signal based on the second clock if it has been determined by at least one means for sampling that the first signal has the predetermined state. Especially for time critical applications, such as a DDR-RAM, a valuable latency saving is provided by the present invention.

7 Claims, 6 Drawing Sheets

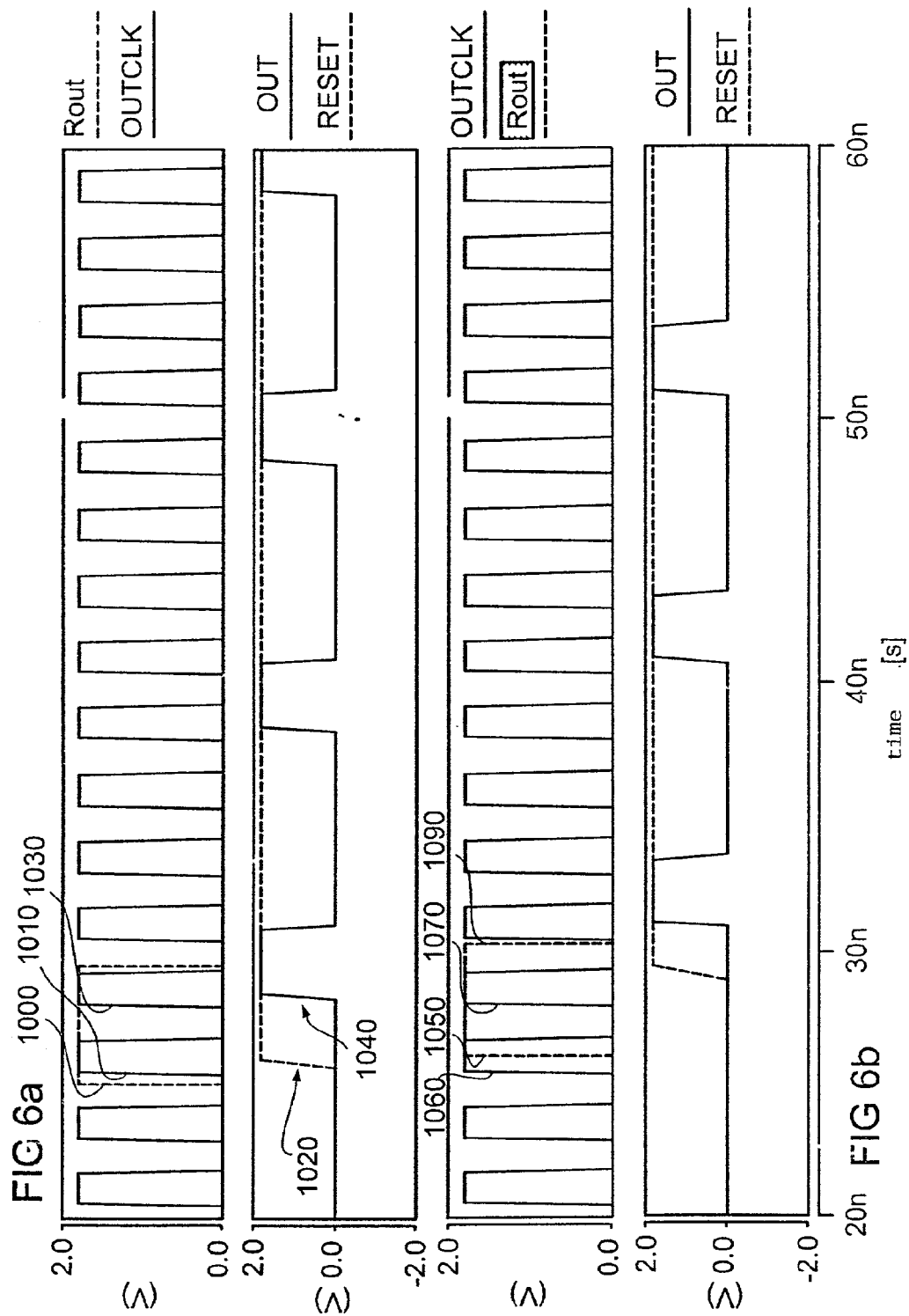

METHOD AND APPARATUS FOR GENERATING A SECOND SIGNAL HAVING A CLOCK BASED ON A SECOND CLOCK FROM A FIRST SIGNAL HAVING A FIRST CLOCK

BACKGROUND OF THE INVENTION

1. Field of the Invention

Generally, the present invention refers to electronic circuits where a signal has to be converted from a first clock domain to a second clock domain as is for example the case with asynchronous circuits when data are accepted with a first clock and passed on with a second clock.

2. Description of the Prior Art

Since the beginning of digital circuit technology the synchronous circuit design has been given preference over the asynchronous circuit design, and the rapid development in the microprocessor technology based on a synchronous circuit technology is mainly responsible for that. Synchronous circuits function like a clocked final state machine where the states of the logic gates change synchronously or always at the same time, respectively. Consequently, synchronous circuits are distinguished by a simple circuit design and a design test is reduced to a test of delays of the combinatorial logic functions between the respective registers of the synchronous circuit.

Lately it has been found that the synchronous circuit design meets fundamental limitations that cannot be solved by synchronous clocking. A first problem is that a circuit can only function synchronously if all its devices receive the clock at the same time, at least to a certain degree. However, the clock signals are electrical signals that are subject to the same delays as other signals when they propagate via the wires. If the delay for a certain part of the circuit makes up a significant portion of a clock cycle duration, this part of the circuit cannot be considered as functioning synchronously with other parts of the circuit anymore. This problem is especially increased by the fact that the circuit complexity of today's integrated circuits increases constantly whereby the length of the electrical signal paths between different circuit parts increases.

Another problem of the synchronous circuit design is the heat development. With the CMOS-technology, for example, the gates only need energy for switching. However, since a single clock clocks the whole circuit there are a lot of gates that only switch because they are linked to the clock but not because they are processing data. Consequently, with the synchronous circuit design, momentarily inactive circuit portions use energy as well, which is especially disadvantageous for multifunctional circuits.

The problem of a global clock is solved by an asynchronous circuit design where the data are not processed by a global clock. Among the different solutions for a realization of an asynchronous clocking is one, for example, where data are transmitted via so called micro lines and thereby captured and latched by latch controllers at different locations within the chip, and they are released only if the next latch controller stage is ready for the receipt of data. This way asynchronous latch chains are developed, where data to be processed are passed on via an acknowledgement or handshake protocol.

In these asynchronous circuits with acknowledgement protocols the timely controlling of data is determined by an asynchronous control signal that passes across the chip together with the data and drives the latch circuits with which the data are captured. In certain cases the data from a latch stage of the asynchronous latch chain are accepted with a capture-clock and passed on to the subsequent latch stage with a second output-clock phase shifted to the first clock, so that it is necessary to convert the transmitted Data from the first clock domain to the other clock domain. Therefore, it is sufficient to convert the asynchronous control signal, by which the capturing of data across the asynchronous latch chain is controlled timely, from the one tact clock domain to the other.

FIG. 5 shows a possible circuit that is able to carry out such a clock domain conversion or such a clock transition. The circuit, generally shown at 800, comprises a circuit part 810 for sampling the incoming asynchronous control signal as well as a circuit part 820 for generating the asynchronous control signal to be output to the following latch stage based on the clock with which the data are to be passed on. The circuit part 810 consists of a D flip-flop 830, an inverter 840 as well as a RS flip-flop 850 consisting of two NAND gates 860 and 870. A first input of the NAND gate 860 is connected to an input Rn 870 of the circuit 800 to receive a reset signal Rn by which the whole asynchronous circuit will be reset. Rn output of the NAND gate 860 is connected to a first input of the NAND gate 870 whereas a second input of the NAND gate 860 is connected to the output of the NAND gate 870, whereby the RS flip-flop 850 is formed.

A second input of the NAND gate 870 is connected to an input Rout 880 of the circuit 800 via the inverter 840 and the D flip-flop 830 to receive the incoming asynchronous control signal Rout that indicates with a logic high that the previous latch stage requests to capture the data transmitted by it. The D flip-flop 830 is connected between the input 880 and the inverter 840 such that its input D is connected to the input 880 and its output Q is connected to the input of the inverter 840. The D flip-flop 830 further comprises an input Rn, connected to the input 870 of the circuit 800 to also be reset with the signal Rn. The D flip-flop 830 further comprises two inputs Cn and C that are connected to the input outclk 910 or the input outclkn 920 respectively, of the circuit 800 via an inverter 890, 900, to obtain the non-inverted clock outclk or the inverted clock outclkn in an inverted way, wherein the clock outclk 910 is the clock with which the data are passed on, while the clock outclkn is 180° phase shifted relative to same.

This way the D flip-flop 830 is clocked with the clock outclk such that it samples the asynchronous control signal Rout with the rising edge of this clock and thereby converts the asynchronous control signal into the clock domain of the output clock. The output sampling signal of the D flip-flop 830 corresponding to the logic sampling states of the asynchronous control signal Rout at the rising edges of the clock outclk is inverted by the inverter 840 and input into the second input of the NAND gate 870.

If the RS flip-flop 850 has been reset by the reset signal Rn, the RS flip-flop 850 changes the logic state at the output of the NAND gate 870 and the output of the circuit part 810, respectively, from that time when the D flip-flop 830 has sampled the first impulse of the asynchronous control signal Rout i.e. a logic high state for the first time, wherein the signal output by the NAND gate 870 will subsequently be referred to as RESET-signal.

The circuit part 820 comprises the two D flip-flops 930, 940, two inverters 950, 960 as well as one NAND gate 970. The D flip-flop 930 and 940 each comprise two clock inputs C, Cn, one reset input Rn, one input D and one output Q. The inputs C of the flip-flops 930, 940 are connected to the input 920 of the circuit 800 via the inverter 900, while the clock input Cn is connected to the input 910 via the inverter 890 such that the flip-flops 930, 940 will be clocked with the clock outclk. The reset input Rn of the flip-flops 930, 940 is connected to the output of the NAND gate 870 or the output of the circuit part 810, respectively, to receive the RESET signal. The Q output of the D flip-flop 940 is connected to the D input of the D flip-flop 930 while the Q output of the D flip-flop 930 is connected to the D input of the D flip-flop 940 via the inverter 950. An output of the inverter 950 is connected to the input D of the D flip-flop 940 as well as with the first input of the NAND gate 970, wherein a second input of the NAND gate 970 is connected to a node 980 between the two D flip-flops 930 and 940. One output of the NAND gate 970 is connected to an output out 990 of the circuit part 820 via the inverter 960.

The circuit part 820 consists mainly of a counter formed by the D flip-flops 930, 940 and the inverter 950 and serves to count four clock impulses with the clock outclk repeatedly, after the time when the D flip-flops 930 and 940 have been reset, i.e. after the impulse of the asynchronous control signal Rout has been sampled for the first time. The signals of the counter at the two outputs of the flip-flops 930 and 940 can thereby assume only four different states that are assumed successively while counting up, whereby only one state exists where the input signals after NAND gate 970 both have a logic high value. That way the NAND gate 970 outputs a new asynchronous control signal at the output out 990 to be passed on, which has a four times slower clock than the clock outclk and begins with the clock cycle of the clock outclk which follows the resetting of the D flip-flops 930 and 940.

Consequently, the circuit 800 generates from the asynchronous control signal, which is present in the clock domain of the capturing clock, at the output out 990 a new asynchronous control signal, which is defined in the clock domain of the output clock, has a four times slower clock than the clock outclk and begins with the clock cycle of the clock outclk following the appearance of a Rout-impulse.

A problem with the circuit 800 is that in the case where the Rout impulse appears after the rising edge of the output clock outclk a whole circle passes until the next rising edges of the output clock outclk. To illustrate this in more detail the asynchronous control signal Rout applied to the output 880, the clock signal outclk, the new asynchronous control signal applied to the output out 990 and the signal RESET output by the circuit part 810 are shown exemplary in FIGS. 6a and 6b in their progress in time for the case where the Rout impulse comes before the rising edge of the output clock and for the case that the Rout impulse comes after the rising edge of the output clock. FIGS. 6a and 6b particularly show two graphs, in the respective top one the signals Rout (broken line) and outclk (continuous line) and in the respective lower one the signals out (continuous line) and reset (broken line) are illustrated and the time across the x-axis is plotted in nano seconds and the signal voltage across the y-axis is plotted in V.

In FIG. 6a that case is illustrated that the Rout impulse or its leading edge 1000 comes before the rising edge 1010 of the clock outclk. In this case the Rout impulse is sampled directly at the rising edge 1010 that is illustrated directly 1020 by the circuit part 810 with the signal RESET. At the next rising edge 1030 of the clock outclk or at the next clock cycle, respectively, the counter of the circuit part 820, reset at the time 1020, generates the new asynchronous control signal from the clock outclk at the output out with a four times slower clock (1040). In the case shown in FIG. 6a the occurring latency is not much longer than one clock cycle of the clock outclk.

In the case shown in FIG. 6b the Rout impulse or its rising edge 1050 comes after the rising edge 1060 of the clock outclk. Consequently, in this case almost one clock cycle passes until the next rising edge 1070 of the clock outclk, until the Rout impulse will be sampled by the D flip-flop 830. Only at the time 1070, which means only at the next edge of the clock outclk, the RESET signal will consequently be generated 1080 to reset the counter of the circuit part 820 that again only generates the new asynchronous control signal at the output out 110 after a next clock cycle, i.e. only with the rising edge 1090. Consequently, the system loses one clock cycle in comparison to the case shown in FIG. 6a, which therefore corresponds to an increase of latency by one clock cycle. Such an increase in latency is mainly a large disadvantage with time critical applications, such as an asynchronous DDR-(double data rate) RAM.

SUMMARY OF THE INVENTION

It is the object of the present invention to provide a method and an apparatus for generating a second signal having a clock based on a second clock from a first signal having a first clock such that the latency for the clock domain transition is less.

In accordance with a first aspect of the present invention this object is achieved by method for generating a second signal having a clock based on a second clock from a first signal having a first clock, the method comprising sampling the first signal with the second clock as well as with a clock phase shifted to the second clock to respectively determine whether the first signal has the predetermined logic state. In case it is determined at at least one of the samples that the first signal has the predetermined state, the second signal will be generated based on the second clock beginning with the subsequent clock cycle of the second clock.

In accordance with a second aspect of the present invention this object is achieved by an apparatus for generating a second signal with a clock based on a second clock from a first signal having first clock, the apparatus comprising first and second means for sampling the first signal to determine whether the first signal has a predetermined logic state, wherein first means sample the first signal with the second clock and second means sample the first signal with a clock phase shifted to the second clock. Means for generating the second signal generates the second signal based on the second clock if at least one means for sampling has determined that the first signal has the predetermined state.

The present invention is based on the knowledge that the above-mentioned problem of the increase of latency when converting the first signal into another clock domain in that case where the impulse of the first signal comes after a sampling time can be eliminated or decreased by sampling the first signal twice within a clock cycle of the second clock, i.e. once with the second clock and once with the clock phase shifted to the second clock, and that the generation of the second signal based on the second clock will already be triggered if at at least one of the two sampling times the impulse of the first signal is sampled or it is determined that the first signal has the predetermined logic state.

In a preferred embodiment of the present invention the phase shift between the two sampling clocks is 180°, whereby the latency is reduced by the duration of one clock cycle. One advantage herein is that the generation of a clock phase shifted by 180° from the second clock is easy and requires for example, only sampling means being constructed the same way with opposite clock driving or clock selection or that such a clock is already present in an existing electronic circuit so that the implementation of the present invention in such an electronic circuit is made easier.

According to one embodiment the present invention is used with an asynchronous latch chain, wherein the first and second signals are asynchronous control signals received or transmitted from latch stage and by which capturing of data across the asynchronous latch chain is timely controlled, the data at the latch stage being passed on with the second clock to the subsequent latch stage and being accepted with a clock from a previous latch stage based on the first clock. The predetermined logic state corresponds to the activated state of the asynchronous control signal by which a subsequent latch stage is requested to capture the data across the data paths of the asynchronous latch chain.

According to one embodiment first means for sampling the first signal comprise a first clock state controlled flip-flop and second means for sampling the first signal comprise a second clock state controlled flip-flop. At one input of the first and second clock state controlled flip-flop the first signal is applied, wherein the first clock state controlled flip-flop is driven with the second clock, while the second clock state controlled flip-flop is driven with the clock phase shifted to the second clock. The clock state controlled flip-flops can for example be D-flip-flops and can also be constructed the same way.

Particularly for time critical applications, such as in a DDR-RAM, the present invention provides a valuable latency saving that significantly predominates the circumstance that the complexity of clock conversion will be increased. Particularly by using a phase shift of 180° and by using sampling means being constructed the same way the additional effort can be kept low.

Advancements and further preferred developments of the present invention are defined in the included claims.

BRIEF DESCRIPTION OF THE DRAWINGS

Preferred embodiments of the present invention will be explained in detail with reference to the accompanying drawings. They show:

FIGS. 6a and 6b wave forms of signals in the circuit of FIG. 5 in that case that the incoming asynchronous control signal comes before or after the output clock.

DESCRIPTION OF PREFERRED
EMBODIMENTS OF THE INVENTION

It should be noted that although the present invention will be described below with reference to FIGS. 3, 4a and 4b according to an embodiment which refers to a clock con-version of an asynchronous control signal in asynchronous circuits, the present invention can also be used in other circuits where a signal has to be converted from a first clock domain into another one. Circuits of such a type further comprise, for example, data transfer interfaces and the like.

Figure 1:
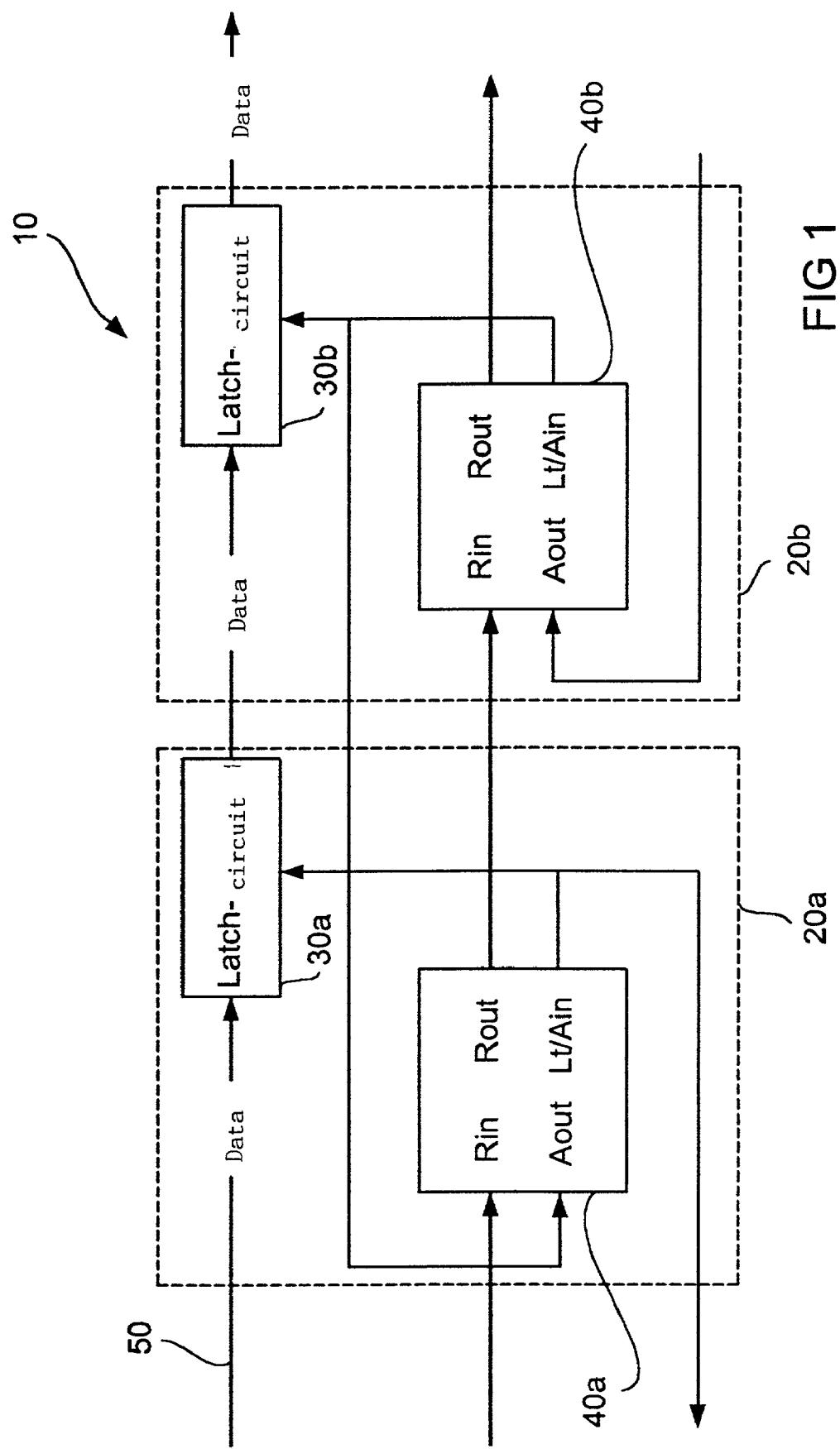
FIG. 1 a block diagram of an asynchronous latch chain using a four phase bundled data protocol.
Figure 2:
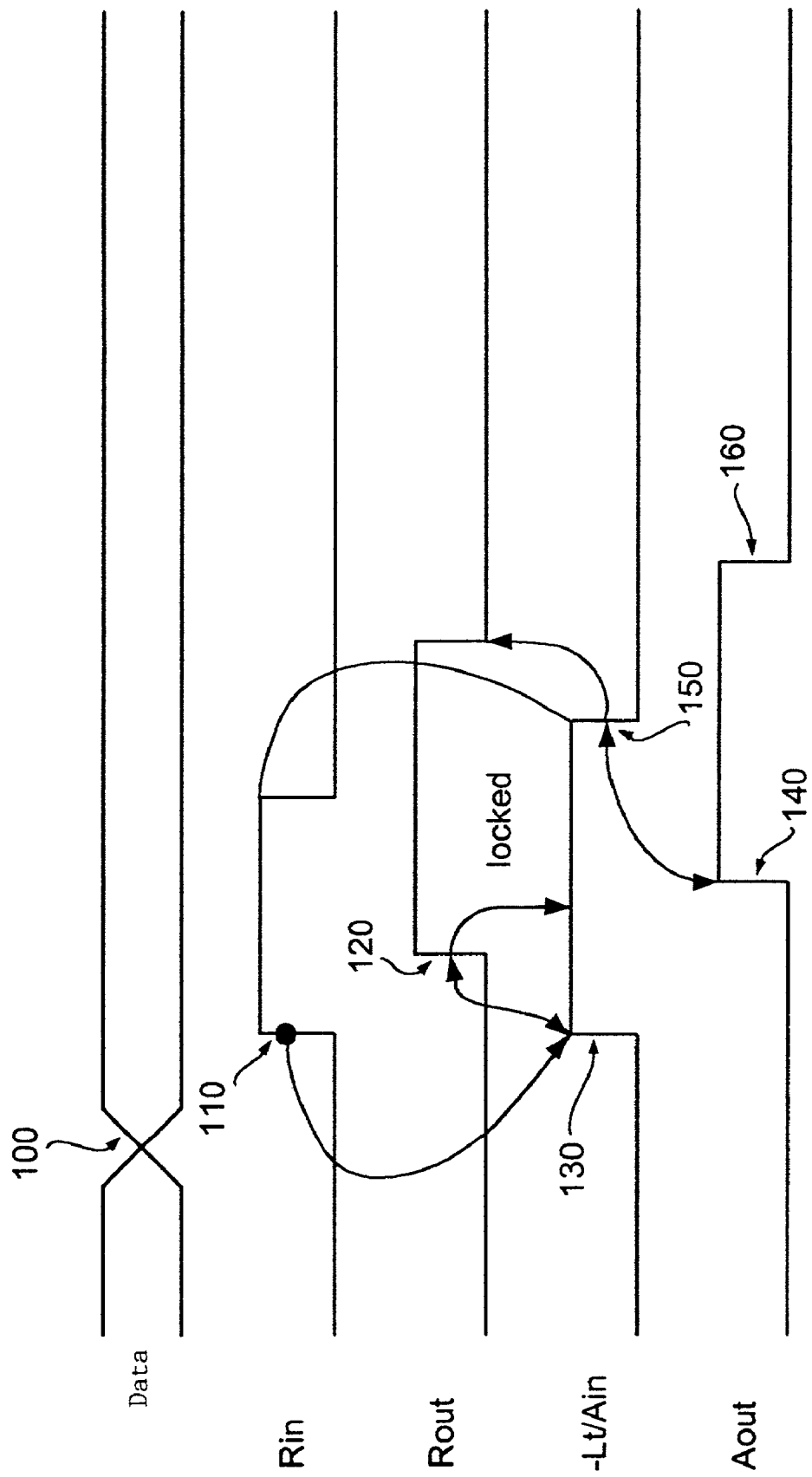
FIG. 2 waveforms appearing in the asynchronous latch chain of FIG. 1 for illustrating the four-phase acknowledgement protocol.

First, referring to FIGS. 1 and 2, the construction and functioning of an asynchronous latch chain with a four phase bundled data protocol is described in place of asynchronous circuits having an acknowledgement protocol. The embodiment described below with reference to FIGS. 3, 4a and 4b can, however, be applied to asynchronous latch chains with other protocols, such as asynchronous latch chains with a two phase protocol without any problems.

First, with reference to FIGS. 1 and 2 the asynchronous circuit technology will be described, especially exemplary referring to asynchronous latch chains with a four phase bundled data protocol. FIG. 1 shows one part of an asynchronous latch chain, generally shown at 10, wherein two latch stages 20a and 20b are included in the shown part. Each latch stage 20a and 20b comprises one latch circuit 30a or 30b and one four phase control circuit 40a or 40b for controlling the latch circuit 30a or 30b. The latch circuits 30a and 30b of the latch stages 20a and 20b are connected in serial at different positions across the chip comprising the asynchronous latch chain 10 in a data path 50, such that an output of the latch circuit 30a is connected to the input of the subsequent latch circuit 40b. The data path 50 can be serial or parallel and consist of one or several data lines, and between the latch circuits of a varying number of data lines, such as, but not limited to, one data line for each bit, wherein the latch stages in the last case can for example be implemented as serializer and deserializer, but also as any other data processing circuit.

Each latch circuit 30a or 30b consisting of one or several latches is connected to a control output Lt/Ain of the four phase control circuit 40a or 40b via a control input. The output Lt/Ain of each control circuit 40a or 40b is further connected to a control input Aout of the control circuit of the respectively preceding latch stage, for example the output Lt/Ain of the control circuit 40b with the input Aout of the control circuit 40a. Above that, each control circuit 40a, 40b comprises another input Rin and another output Rout, wherein the output Rout is always connected to the input Rin of the control circuit of the subsequent latch stage, such as the output Rout of the control circuit 40a with the input Rin of the control circuit 40b.

In the following the mode of operation of the asynchronous latch chain shown in FIG. 1 as well as its four-phase protocol will be explained, when the asynchronous latch chain is built into a chip, such as a DDR-RAM chip. The data flow across the data path 50 through the chip is controlled by the asynchronous latch stages 20a, 20b by capturing and latching the data at different positions of the chip to time this directing of data through the chip and to provide a temporary storage of data while the data will be serialized or deserialized for a data output or input, respectively. In a DDR chip, in case of write instructions, the data to be written would be deserialized after the receiver circuit and then written to the read write amplifier. In the read direction data would be read at the write read amplifier and be serialized again before the off chip or output driver. Provided in parallel to the shown data flow control circuitry is a synchronous control circuitry that offers a stable timing control environment for serializing and deserializing the data.

For controlling the data path the four phase bundled data protocol explained below will be used, where between the control circuits 40*a*, 40*b* two input signals and two output signals respectively will be swapped, but will in the following be referred to as the inputs or outputs of the control circuits 40*a*, 40*b* from which they are output or into which they are input. An output signal Rout will be output from the control circuitry 40*a*, 40*b* to request the control circuit of the next latch stage in the latch chain 10 or the line to capture those data stored in the latch circuit of the requesting latch stage on the data path 50. A control and acknowledgement output signal Lt/Ain will be output from one latch stage to the control circuit of the previous latch stage and to the latch circuit of the same latch stage to put the latch circuit in a state where it captures the data on the data path 50 or latches them, and to acknowledge the previous latch stage that the data announced by its output signal Rout have been received. The output signals Rout and Lt/Ain reach the subsequent or previous latch stage as input signal Rin or Aout. The input signal Rin acts as a request at the subsequent latch stage that the incoming data on the data path 50 will be captured or latched by the latch circuit. The input signal Aout acts as an acknowledgement signal in the previous latch stage from the respectively previous latch stage in the line that acknowledges the previous latch stage that the data passed on have been received from the subsequent latch stage.

With reference to FIGS. 1 and 2 in the following the signalling protocol will be described in detail, wherein FIG. 2 shows the wave forms of the signals Rin, Rout, Lt/Ain and Aout (from top to bottom on top of each other) in their progress in time (vertically aligned from left to right) that occur for example between the latch stages from FIG. 1. In the protocol of FIG. 2 it is assumed that the data latch circuits are opaque or in a capturing state when the control signal Lt/Ain is high. Consequently the data will be held so long at the latch stage until the next latch stage in the line signals that the transferred data have been received.

The protocol shown in FIG. 2 is a four-phase protocol that is used to transmit data across the chip wherein the data are moved from latch stage to latch stage. At a time 100 valid data are provided at the latch stage or a controller 20*a* at the data output, whereupon it outputs a Rout signal. This signal is received at the subsequent controller 20*b* at the input Rin, whereupon it transmits 120 a Rout signal to the following controller in the line and thereby captures or latches 130 the bundled data at the latch circuit 30*b* by using the Lt/Ain signal. The Lt/Ain signal will be set back to the Aout input at the previous controller 20*a* in the line to acknowledge 140 the input into the latch circuit 30*b* of the current controller 20*b*. The data will be held in the latch circuit 30*b* until the Aout and Rin input signal at the current controller 20*b* are asserted or deasserted, respectively, which is the case at 150. At this time 150 the latch circuit 30*b* of the current controller 20*b* will be made transparent to allow new data to pass and to be captured and latched in the next line cycle. Another controller cycle cannot occur at the outputs of the current controller 20*b* until the input Aout will be deasserted by the Lt/Ain signal of the subsequent controller as is the case at 160. In other words, the output Rout of the current controller 20*b* cannot go high until the input Aout or the output Ain of the following controller has gone low provided that the signal Rin or the output Rout of the previous controller 20*a* has gone high to indicate that a new line cycle has occurred.

It should be noted again that the scheme shown in FIG. 2 has only been chosen as an example and that other protocols can be used for the control of the data transfer between the serializers or parallel-serial-converters and deserializers or serial-parallel-converters for each further data path steering request across the chip.

In one particular case data on the data path 50 will be accepted from one latch stage, such as latch stage 20*a* with a capturing clock and will be passed on to a following latch stage, for example 20*b* with a second output clock phase shifted to the capturing clock. In this case the data have to be converted from the clock domain of the capturing clock into the clock domain of the output clock.

As already mentioned in the introduction of the description it is therefore enough to convert the asynchronous control signal Aout from the one clock domain to the other. One circuit according to one embodiment of the present invention that is able for that is shown in FIG. 3. It should be noted that those elements of the circuit from FIG. 3 that are identical with elements of FIG. 2 are provided with the same reference numbers, and that a repeated description of these elements has been omitted.

Figure 3:
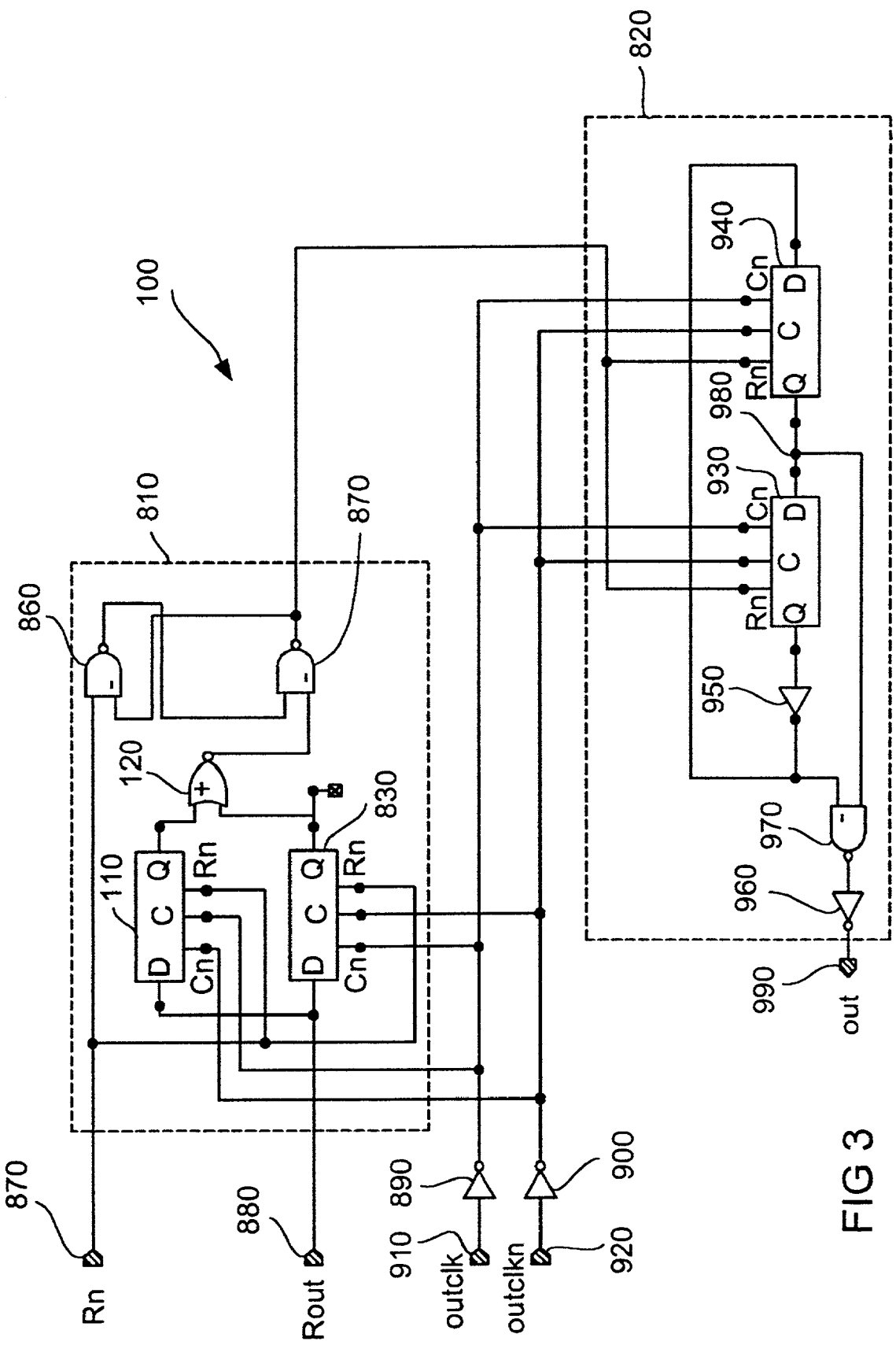
FIG. 3 a circuit diagram of a circuit for converting an asynchronous control signal from a first clock domain into a second clock domain according to an embodiment of the present invention.
Figure 5:
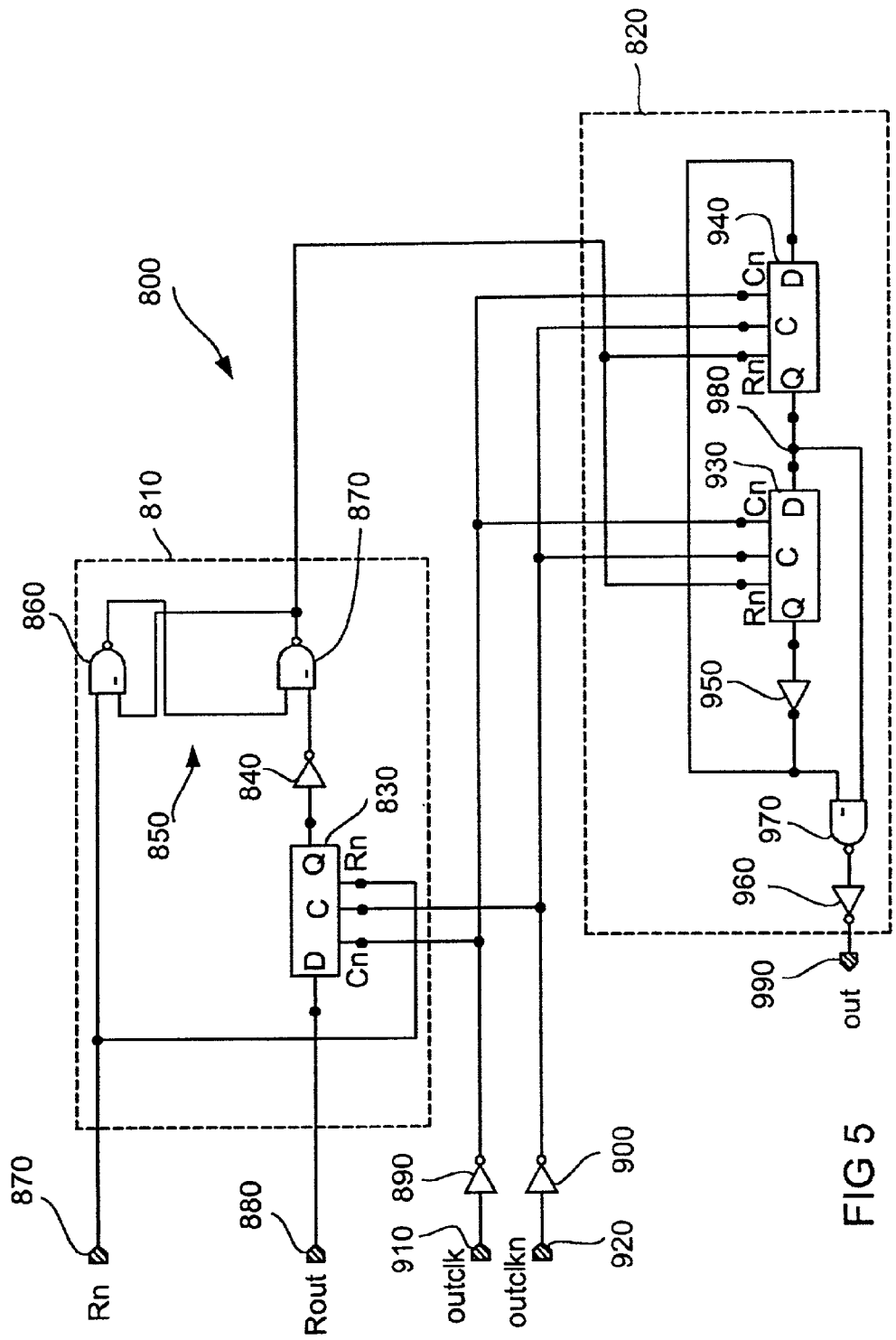
FIG. 5 a circuit diagram of a circuit for converting an asynchronous control signal from a first clock domain into a second clock domain that is not constructed according to the present invention.

The circuit shown in FIG. 3, generally shown at 100 differs from the circuit shown in FIG. 5 only in that the D flip-flop 830 of the circuit part 810 has a second D flip-flop 110 connected in parallel wherein its input Rn with the input 870 Rn of the circuit 100, the input D with the input Rout 880 of the circuit 100 and the clock inputs Cn and C are, in comparison to those of the D flip-flop 830, exactly oppositely connected to the clock input 910 and 920, namely the input C with the input 910 via the inverter 890 and the input Cn with the input 920 via the inverter 900, so that the D flip-flop 110 will be driven with the clock 180° phase shifted relatively to the clock driving the D flip-flop 830, namely the clock outclkn. The output Q of the D flip-flop 110 and the D flip-flop 830 are connected to the two inputs of an NOR gate 120, wherein one of its outputs is connected to the second input of the NAND gate 870.

By the opposite phase selection of the parallel connected D flip-flops 110 and 830 and by the OR link of its two outputs the asynchronous control signal Rout will be sampled with the clock outclk and with the clock outclkn, which is 180° phase shifted. The two sampling signals output by the D flip-flops 110 and 830 show the logic states of the asynchronous control signal Rout sampled with the clock outclk or the opposite phase clock outclkn. Due to the NOR gate 120 it is sufficient for triggering the counter of the circuit part 820 if at one time at least one of the two sampling signals or output signals of the D flip-flops 810 and 830 goes high or shows that the Rout impulse has arrived.

To describe the interaction of the two opposed driven D flip-flops 110 and 830 and the NOR gate 120 in more detail, and to illustrate how it is made possible that the signal Rout can come up to a half clock cycle later than in the circuit of FIG. 5 without the loss of one clock cycle latency described with reference to the circuit of FIG. 5 occurs, exemplary wave forms for the asynchronous control signal Rout, the output clock outclk, the generated new asynchronous control signal at the output out 990 and the signal RESET output from the circuit part 810 for a case where the Rout impulse comes before the rising edge of the output clock and for the case that the Rout impulse comes after the rising edge of the output clock are illustrated in their progress in time in FIGS. 6*a* and 6*b*. As in FIGS. 6*a* and 6*b*, FIGS. 4*a* and 4*b* also show two graphs each, wherein in the respective top one the signals Rout (broken line) and outclk (continuous line) and in the respective lower one the signals out (continuous line) and Reset (broken line) are shown, and where the time is plotted across the x axis in nanoseconds and the signal voltage is plotted across the y axis in V.

FIG. 6a shows the waveforms in the case where the Rout impulse or its leading edge 200 occurs before the rising edge 210 of the clock outclk. In this case, like in the case of the circuit from FIG. 5, the D flip-flop 830 samples the signal Rout and triggers the counter of the circuit part 820, 220 via the signal RESET, that then begins the generation of the new asynchronous control signal at the output out 230 with the beginning of the subsequent clock cycle.

FIG. 6a shows the case that the Rout impulse or its rising edge comes after the rising edge 250 of the signal outclk. In this case the D flip-flop 830 samples the signal Rout at a time when the signal Rout is still low and consequently not asserted. The opposite phase driven D flip-flop 110 clocks the asynchronous control signal Rout half a clock cycle later, namely at the falling edge 260 of the clock outclk at that time when the signal Rout is already high, i.e. asserted. The D flip-flop 110 shows this by a high sampling signal at the output Q whereby the counter of the circuit part 820 is triggered or reset, respectively, via the signal RESET via the NOR gate 120 and the NAND gate 870. Thereupon the counter begins at the next rising edge of the clock outclk 280 with the generation of the new asynchronous control signal at the output out 990 (290).

As can be seen from FIGS. 6a and 6b the counter begins to generate the new asynchronous control signal with the same next output clock edge since in both cases the signal RESET converts to a logic high before the next rising edge 280 and 300, i.e. after the rising edge of the Rout impulse of the output clock outclk (see 220 and 270). The latency or that the data need to get through the data path is decreased by one clock cycle all in all in comparison to the circuit of FIG. 5.

With reference to the previous description it should be noted that the present invention can be applied to all circuits where one signal is to be converted from one clock domain into another, for example in interfaces between two transmission links of different clock frequencies and in asynchronous latch chains with a four phase or two phase protocol, for example.

Figure 4:
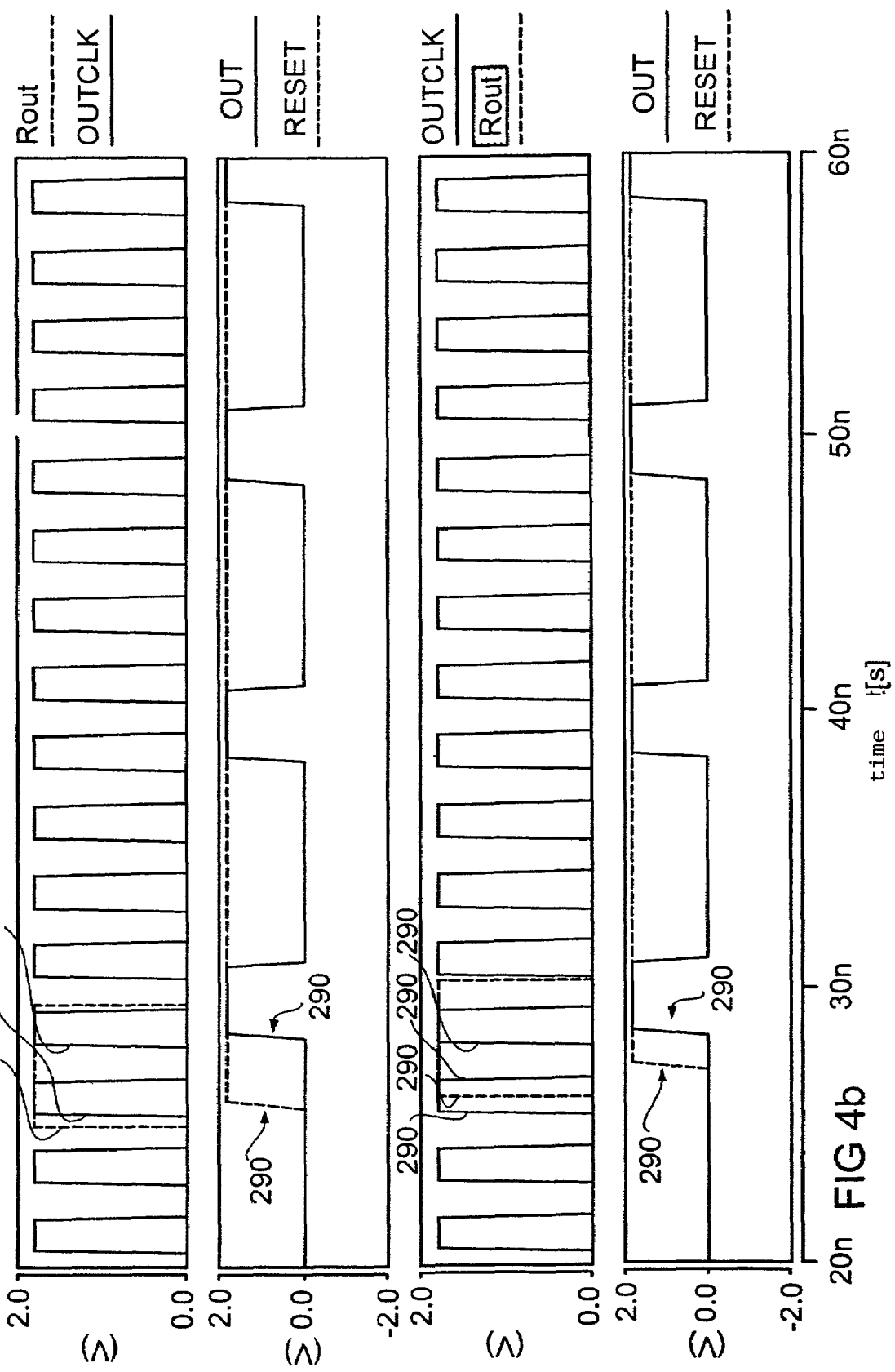
FIG. 4a wave forms of appearing signals in the circuit of FIG. 3 for the case that the incoming asynchronous control signal comes before or after the output clock.

With reference to the embodiment of FIGS. 3 and 4 it should be noted that the sampling of the incoming asynchronous control signal can also be obtained by other means as a D flip-flop, such as by a clock state controlled flip-flop of a different type. Further, instead of the NOR gate, different means can be provided to ensure that the generation of the new asynchronous control signal will be carried out if both or at least one of the sampled logic states of the incoming asynchronous control signal corresponds to the predetermined or asserted state, such as especially an OR gate. The generation of the new asynchronous control signal based on the output clock can be carried out by different means than a counter and can especially comprise the generation of a new asynchronous control signal having a clock frequency which is lower than the output clock an integer multiple. Although the phase shift of the two clocks with which the sampling at the D flip-flops is carried out was 180° in the previous embodiment, other phase shifts are possible.

Above that the present invention can be implemented in any technology, such as an integrated circuit in CMOS or BiCMOS or as wired board circuit.

Although previously D flip-flops that were constructed the same way and have been oppositely clockwise driven have been used, it is further possible that two different flip-flops with different response times will be used, that are driven with the same clock, such as outclk, but due to the different response times they sample the asynchronous control signal Rout with a different phase or time shift to the clock outclk, so that all in all two samplings of the signal Rout are carried out with two clocks phase shifted from each other. The actual generation of the new asynchronous signals, for example by the previously described counter would be started by one of the samplings and be performed based on the second clock.

What is claimed is:

1. An Apparatus for generating a second signal having a clock based on a second clock from a first signal having a first clock, comprising:

means for sampling the first signal with the second clock to determine whether the first signal has a predetermined logic state, the means for sampling the first signal with the second clock including a first clock state controlled flip-flop driven by the second clock with an input where the first signal is applied and an output for outputting a first sampling signal indicating a logic state of the first signal sampled with the second clock;

means for sampling the first signal with a clock phase shifted to the second clock to determine whether the first signal has the predetermined logic state, the means for sampling the first signal with a clock phase shifted to the second clock including a second clock state controlled flip-flop driven by the clock phase shifted to the second clock with an input where the first signal is applied and an output for outputting a second sampling signal indicating a logic state of the first signal sampled with the clock phase shifted to the second clock;

means for generating the second signal based on the second clock beginning with the subsequent clock cycle of the second clock if it has been determined by at least one of the sampling means that the first signal has the predetermined logic state;

means for carrying out an OR link having a first input connected to the output of the first clock state controlled flip-flop, a second input connected to the output of the second clock state controlled flip-flop and an output connected to means for generating, wherein said means for generating are responsive to means for carrying out an OR link to begin generating the second signal at the subsequent clock cycle; and said means for generating include:

an RS flip-flop with a set input connected to the output of means for carrying out an OR link, a reset input for receiving a reset signal and an output; and a counter having a reset input connected to the output of the RS flip-flop, an input for receiving the second clock and an output for outputting a clock divided by a predetermined power of 2 as the second clock beginning at the subsequent clock cycle.

2. The Apparatus according to claim 1, wherein the first and second signals are asynchronous control signals.

3. The Apparatus according to claim 1, wherein the samplings are carried out by the sampling means at the rising or falling edge of the second clock or the clock phase shifted to the second clock.

4. The Apparatus according to claim 1, wherein the clock phase shifted to the second clock is phase shifted by 180° from the second clock.

5. The Apparatus according to claim 1, wherein, the first and the second clock state controlled flip-flops are constructed the same way.

6. The apparatus according to claim 1, wherein the means for generating the second signal is designed such that the generation of the second signal is performed such that the generation begins at a clock cycle of the second clock beginning with a clock pulse of the second clock which immediately follows the time when it has been determined by at least one of the sampling means that the first signal has the predetermined logic state.

7. The apparatus according to claim 1, wherein the means for sampling the first signal with the second clock, the means for sampling the first signal with a clock phase shifted to the second clock, and the means for generating the second signal are designed such that the predetermined logic state is a logic high value.

* * * * *